(12) United States Patent
Kubota et al.

(10) Patent No.: US 6,444,899 B2
(45) Date of Patent: Sep. 3, 2002

(54) SOLAR CELL AND METHOD OF FABRICATING THE SAME

(75) Inventors: Yuichi Kubota, Chiba (JP); Kazuo Nishi, Yamanashi (JP)

(73) Assignees: TDK Corporation, Tokyo (JP); Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 09/746,566

(22) Filed: Dec. 21, 2000

(30) Foreign Application Priority Data

Dec. 22, 1999 (JP) ............................................ 11-363714

(51) Int. Cl.$^7$ .................... H01L 31/04; H01L 31/05; H01L 31/18
(52) U.S. Cl. .................. 136/256; 136/244; 136/258; 136/249; 257/461; 257/464; 257/443; 438/80; 438/98; 438/97
(58) Field of Search ................. 136/244, 256, 136/258, 249; 257/461, 464, 443; 438/80, 98, 97

(56) References Cited

U.S. PATENT DOCUMENTS

| | | | |
|---|---|---|---|
| 5,348,589 A | 9/1994 | Arai et al. | 136/244 |
| 5,453,134 A | 9/1995 | Arai et al. | 136/244 |
| 5,637,156 A | 6/1997 | Kubota et al. | 136/251 |
| 5,994,642 A | * 11/1999 | Higuchi et al. | 136/260 |
| 6,051,778 A | * 4/2000 | Ichinose et al. | 136/256 |
| 6,268,558 B1 | * 7/2001 | Kubota | 136/244 |

FOREIGN PATENT DOCUMENTS

| | | | |
|---|---|---|---|
| EP | 0 986 109 A1 | | 3/2000 |
| JP | 01-025235 | | 5/1989 |
| JP | 1-168073 A | * | 7/1989 |
| JP | 05-183177 | | 7/1993 |
| JP | 08-231675 | | 9/1996 |
| JP | 2698401 B2 | | 9/1997 |
| JP | 11-121779 A | * | 4/1999 |
| JP | 11-330506 A | * | 11/1999 |
| JP | 11-340490 | | 12/1999 |

* cited by examiner

Primary Examiner—Alan Diamond
(74) Attorney, Agent, or Firm—Fish & Richardson P.C.

(57) ABSTRACT

It is achieved to provide a solar cell in which stability at a connection portion between a circuit substrate of an electric instrument and a rear electrode, and reliability against electrostatic damage are improved, and also to provide a method of fabricating the same. A rear electrode is formed of a material containing carbon as a main ingredient. In formation of the rear electrode, a thermosetting conductive carbon paste is used and the formation is made by a printing method. Further, when the resistance values of the transparent electrode layer and the rear electrode layer are made the same level and are balanced, the resistance against electrostatic damage can be remarkably improved.

16 Claims, 7 Drawing Sheets

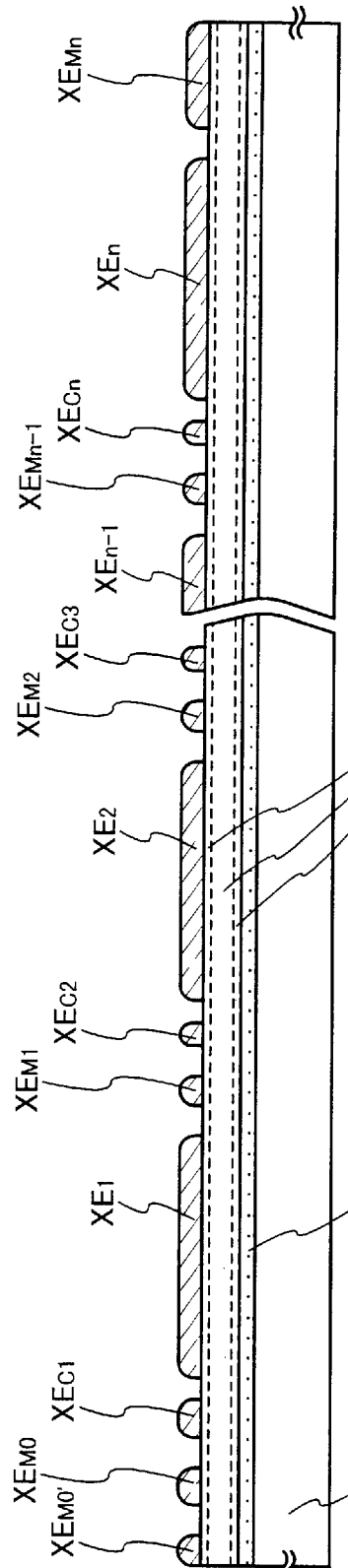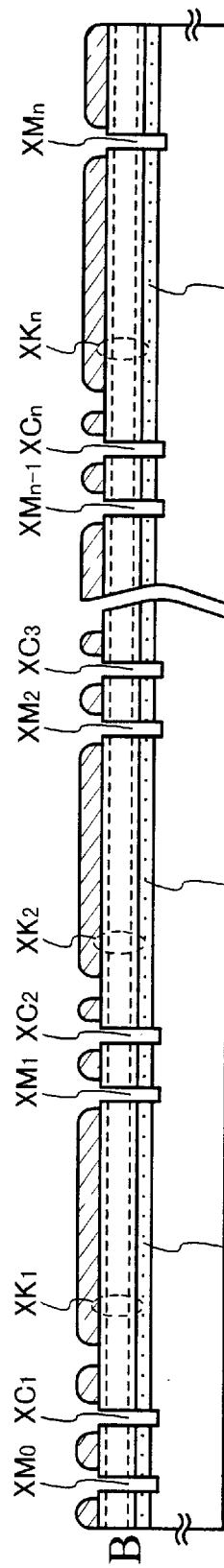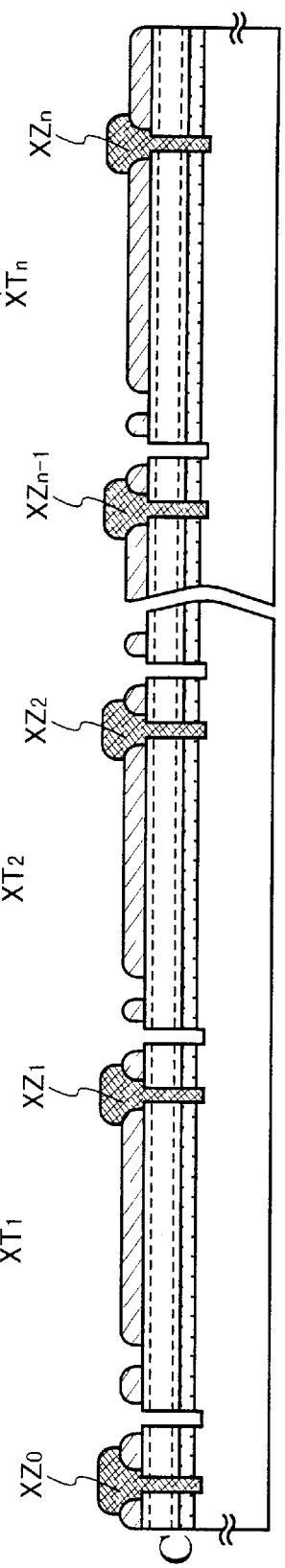

SOLAR CELL AND METHOD OF FABRICATING THE SAME

BACKGROUND OF THE INVENTION

1. Field of the Invention

The present invention relates to a structure of a solar cell well suited for a power source of electric instrument with low power consumption, such as a calculator and a watch, and also relates to a method of fabricating the same.

2. Description of the Related Art

Solar cells are becoming popular not only for a sunlight electrical generating system, which is installed outdoors, but also for a power source of electric instrument with low power consumption, such as a calculator, a radio, and a watch. In such a consumer use, for example, like a wrist watch, in the case where importance is attached to not only the function but also to its external design, a mounting method of the solar cell is also devised. The solar cell is directly used as a face of the watch, or is installed under a semitranslucent face of watch to make it unnoticeable.

In most of solar cells in the consumer use, glass, stainless, organic resin material or the like is used for a substrate, and a photoelectric conversion layer is formed thereon with a thin film of amorphous semiconductor, microcrystalline semiconductor, or chalcopalide-based (or II–VI group) compound semiconductor. Especially, the solar cell using an organic resin material for the substrate is thin and lightweight, and has an excellent shock resistance so that it is not cracked even if it is dropped. Accordingly, it is suitable for the solar cell to be mounted to a portable product, such as a card type calculator, a wrist watch, and a remote-control device of an indoor electric instrument such as a television.

In the solar cell fabricated by using the organic resin material for the substrate, there is a well known technique for forming a photoelectric conversion layer with a non-monocrystalline semiconductor material, such as amorphous silicon or microcrystalline silicon, fabricated by a plasma CVD method. As means for increasing the productivity of such a solar cell and decreasing the manufacturing costs, there is known a roll-to-roll method in which a long organic resin film substrate wound into a roll shape or a metal film substrate of a stainless alloy etc., is fed out from one side of substrate holding means provided in a plasma CVD apparatus, a sputtering apparatus, or another manufacturing apparatus, the substrate is made to continuously (or stepwise) move in a treatment space of coating formation or the like, and it is rewound by substrate holding means provided at the other side.

In addition, there is known a method in which a rear electrode opposite to a transparent electrode provided at an incident side of light is formed by printing a paste containing a powder of conductive material with a binder of organic resin material, instead of a metal film by a sputtering method, a vacuum evaporation method, etc. Japanese Patent No. 2698401 discloses a technique in which a rear electrode of a solar cell is formed by a printing method using a conductive paste containing a conductive material of molybdenum powder with a binder of phenolic resin.

As a method of connecting a circuit substrate of a calculator, a watch, a remote-control device of an indoor electric instrument, or the like to an output terminal of a solar cell, in addition to soldering or a method of thermocompression bonding of a flexible printed substrate by an anisotropic conductive adhesive, a pressure contact system using a spring terminal is adopted. Although this method can prevent damage by heat from being applied to the solar cell, if the output terminal is formed of a metal material, similarly to the rear electrode, there has been a problem of aging of contact resistance due to surface oxidation or the like. Thus, contrivance has been made such that a carbon electrode is intentionally provided at this portion.

Since a conductive carbon electrode film obtained by applying a carbon paste by a printing method, drying and hardening, is not oxidized, the aging of the contact resistance to a spring terminal is small. Therefore, it is regarded as a suitable material. However, there has been a problem in that the contact resistance to a semiconductor layer is high, and peeling and warp of a substrate, etc. would occur.

On the other hand, as another problem, like a consumer use electric instrument, in the case where importance is mainly attached to photoelectric conversion characteristics under low illumination in an indoor environment or the like, a minute short circuit region is formed between a transparent electrode and a rear electrode by electro-static damage, and output voltage is lowered. As a result, the reliability of a product has been remarkably deteriorated.

SUMMARY OF THE INVENTION

The present invention is a technique for solving the foregoing problems, and an object thereof is to provide a solar cell in which stability at a connection portion between a circuit substrate of an electric instrument and a rear electrode, and reliability against electro-static damage are improved, and also to provide a method of fabricating the same.

In order to achieve the object, according to the present invention, in a solar cell using an organic resin material for a substrate, a rear electrode is formed of a material containing carbon as a main ingredient. In formation of the rear electrode, a thermosetting conductive carbon paste is used and the formation is made by a printing method.

A conventional conductive film formed by mixing and dispersing a powder of conductive material on a flexible substrate using a binder of organic thermoplastic resin is weak to an organic solvent, and at the time of formation of an insulating sealing resin layer formed thereon, expansion and dissolving of the resin component by the solvent occurs. Therefore, it has not been capable of being used. Besides, in an environment resistance test of the conductive film itself, a matrix component of the resin easily receives the influence of the change of temperature and humidity, and softened resin is apt to intervene between contacted conductive fine powders, and as a result, series resistance is increased. Consequently, it has not been capable of withstanding the environment resistance test.

Therefore, a resin binder in view of the following points is used for the conductive film of the thermosetting conductive carbon paste of the present invention. First, conductive fine particles are highly filled to raise conductivity of the film, and at the same time, the molecular structure of a matrix resin component of the film and a crosslinking agent are optimized to obtain the conductive electrode film having high heat resistance and humidity resistance and the matrix resin of sufficiently high crosslinking strength. Even when the upper portion of this electrode film is covered with, for example, an insulating ink film, it has such solvent resistance that it sufficiently withstands the contained solvent. Besides, with respect to the conductive contact at the interface between the conductive fine particle and a transparent thin film conductive film as well, the resin matrix is not swelled and dissolved, and can be firmly fixed. Further, against the increase of temperature and humidity as well, since the heat resistance and humidity resistance of the resin matrix is improved, the change of mechanical properties is small. As an example of a method of obtaining a conductive coating film including such resin matrix, a saturated polyester resin having the highest possible residual hydroxyl group content is used, and in order to keep the pot life of a curing agent having high reactivity with this functional group, that is, a conductive ink more stably in a period including the time of screen printing, such resin blending composition is designed that glass transition temperature (Tg) becomes at least 70° C. or more by high density thermal crosslinking using the curing agent, such as multi-functional block isocyanate compound which is made inactive under room temperature by a block agent and easily dissociates isocyanate especially at low temperature, or melamine resin. More specifically, the thermosetting conductive paste is formed such that its main component is a conductive coating matrix resin typified by saturated polyester resin in which a dispersion property enabling conductive carbon fine particles to be highly filled, a printing property, and conductive coating formation performance thereafter are excellent, consideration is sufficiently paid to monomer blending at the time of condensation polymerization of dicarboxylic acid and diol, an OH value content is high, and Tg is higher than that of the resin, and a resin binder is a combination with block isocyanate which easily dissociates highly reactive isocyanate groups by low temperature heating.

When the fine granular conductive carbon particles are obtained by mixing artificial graphite of an average particle diameter of 0.1 to several tens of $\mu$m into the carbon particles at a mixing ratio of 1/3 to 3/1 in weight ratio and by further making the particles fine by a ball mill or the like, it is effective in decrease of the electric resistance of a carbon conductive coating film.

The organic resin material is generally apt to be charged, and the electrostatic withstand voltage of a solar cell formed thereon becomes deteriorated. In order to improve the electrostatic withstand voltage between terminals, the resistance of the transparent electrode and the rear electrode is rather made high so that the electric field is not concentrated on the element portion. The sheet resistance of the conductive film using the thermosetting conductive carbon paste and formed by the printing method is 30 to 80 $\Omega/\square$, and it is possible to make the resistance just coincident with the value of the transparent electrode formed of ITO.

BRIEF DESCRIPTION OF THE DRAWINGS

In the accompanying drawings:

FIGS. 3A to 3C are sectional views for explaining a fabricating process of a solar cell;

DETAILED DESCRIPTION OF THE PREFERRED EMBODIMENTS

Embodiment 1

An embodiment of the present invention will be described with reference to FIGS. 1A to 1C and FIG. 2. A method of fabricating an integrated solar cell in which an organic resin material is used for a substrate and a plurality of unit cells are connected in series with each other on the same substrate, is disclosed in Japanese Patent Application Laid-open No. Hei 5-183177, and also in this embodiment, the solar cell is fabricated using the method of the publication.

Figure 1A:
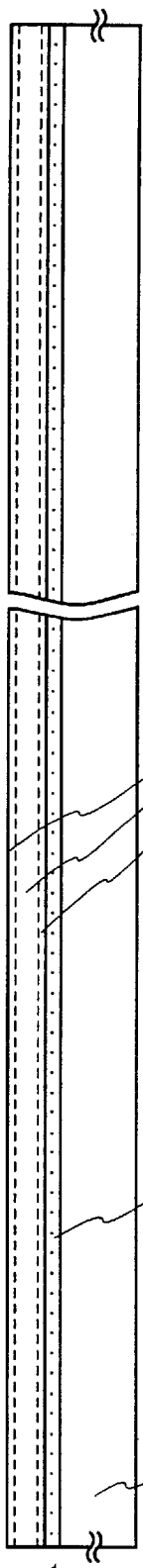
FIGS. 1A to 1C are sectional views for explaining a fabricating process of a solar cell.

In FIG. 1A, a translucent organic resin material, such as polyethylene terephthalate (PET), polyethylene naphthalate (PEN), or polyethersulfone (PES), is used for a substrate 101. Of course, other commercially available soda-lime glass or alkali-free glass can also be used.

A sheet-like substrate of a suitable size may be used, or as described before, on the assumption that the process is carried out by the roll-to-roll method, a substrate wound into a roll shape may be used. In the case where the roll-to-roll method is applied, it is appropriate that an organic resin film substrate having a thickness of 60 to 100 $\mu$m is used.

The solar cell fabricated in this embodiment has such a structure that light is received by a surface of a substrate opposite to a surface on which a photoelectric conversion layer is formed, and first, a transparent electrode layer 102 is formed on the substrate 101. The transparent electrode 102 is formed of indium tin oxide alloy (ITO), zinc oxide (ZnO), tin oxide ($SnO_2$), ITO-ZnO alloy, or the like to a thickness of 40 to 200 nm (preferably 50 to 100 nm). However, since the continuously usable maximum temperature of the foregoing organic resin material is 200° C. or less, a sputtering method, a vacuum evaporation method or the like is used for the formation of the transparent electrode layer 102, and the formation is carried out while the substrate temperature at the film formation is limited within the range from room temperature to about 150° C. Detailed forming conditions may be suitably determined by an operator to obtain a sheet resistance of 20 to 200 $\Omega/\square$ for the above film thickness.

In view of decreasing the resistance of the transparent electrode layer, an ITO film is suitable. However, when a semiconductor layer is formed thereon, if the ITO film is exposed to a plasma atmosphere containing hydrogen, it is reduced and becomes opaque. In order to prevent this, it is appropriate that a $SnO_2$ film or a ZnO film is formed on the ITO film. The ZnO (ZnO:Ga) film containing gallium (Ga) of 1 to 10 wt % has high transmittance and is a material suitable to be laminated on the ITO film. As an example of the combination, when the ITO film is formed to a thickness of 50 to 60 nm and the ZnO:Ga film with a thickness of 25 mn is formed thereon, it is possible to prevent transparency from being lost, and an excellent light transmitting property can be obtained. In this laminate film, a sheet resistance of 120 to 150 $\Omega/\square$ can be obtained.

A non-monocrystalline semiconductor film formed by using a plasma CVD method is used for a photoelectric conversion layer 103. Typically, it is a hydrogenated amorphous silicon (a-Si:H) film formed using $SiH_4$ gas as a raw material, and in addition to this, it may be formed of a hydrogenated amorphous silicon germanium (a-SiGe:H) film, a hydrogenated amorphous silicon carbon (a-SiC:H) film, a hydrogenated microcrystalline silicon ($\mu$c-Si:H) film, or the like. Although the photoelectric conversion layer is formed of a p-i-n junction, p-type and n-type layers in which valence electron control is made, may be formed by using aSi:H or $\mu$c-Si:H added with an impurity element such as boron or phosphorus. Especially, for the purpose of lowering light absorption loss or forming excellent ohmic contact with the transparent electrode or the rear electrode, $\mu$c-Si:H is suitable.

FIG. 1A shows a state where the photoelectric conversion layer 103 is made of a laminate of a p-type layer 103a, an i-type layer 103b, and an n-type layer 103c from the side of the transparent electrode layer 102, and the thicknesses of the respective layers are 10 to 20 nm for the p-type layer, 200 to 1000 nm for the i-type layer, and 20 to 60 nm for the n-type layer. When the p-i-n junction is formed of such non-monocrystalline silicon material, an open circuit voltage of about 0.4 to 1 V can be obtained. If this p-i-n junction is made one unit and a plurality of such units are laminated to form a stack type structure, the open circuit voltage can also be raised.

Figure 1B:
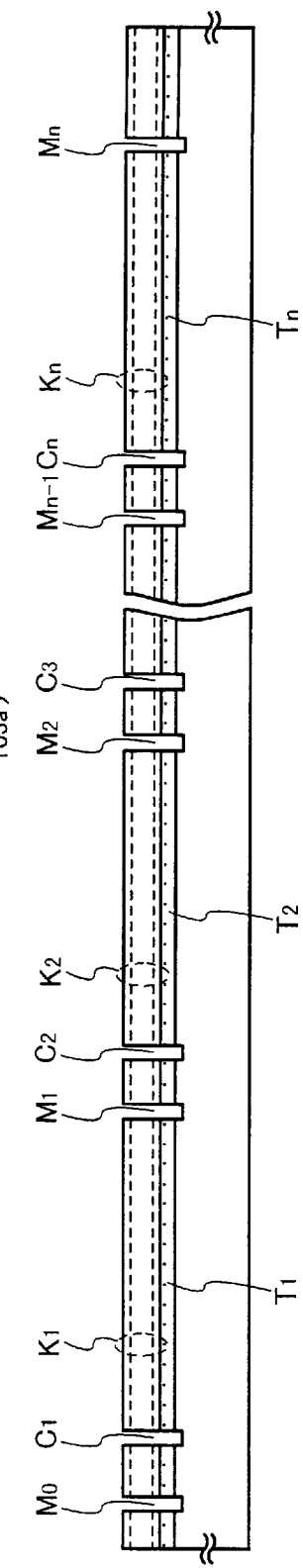

As shown in FIG. 1B, in order to form a plurality of unit cells on the same substrate, openings $M_0$ to $M_n$ and $C_1$ to $C_n$ reaching the transparent electrode layer 102 from the photoelectric conversion layer 103 are formed by a laser working method. The openings $M_0$ to $M_n$ are openings for insulation and separation and are provided to form the unit cells. The openings $C_1$ to $C_n$ are openings for forming connection between the transparent electrode and the rear electrode. Although the kind of a laser used for the laser working method is not restricted, a Nd-YAG laser, an excimer laser, or the like is used. At all events, by performing the laser working in the state where the transparent electrode layer 102 and the photoelectric conversion layer 103 are laminated, it is possible to prevent the transparent electrode layer from peeling off the substrate at the working.

Figure 1C:
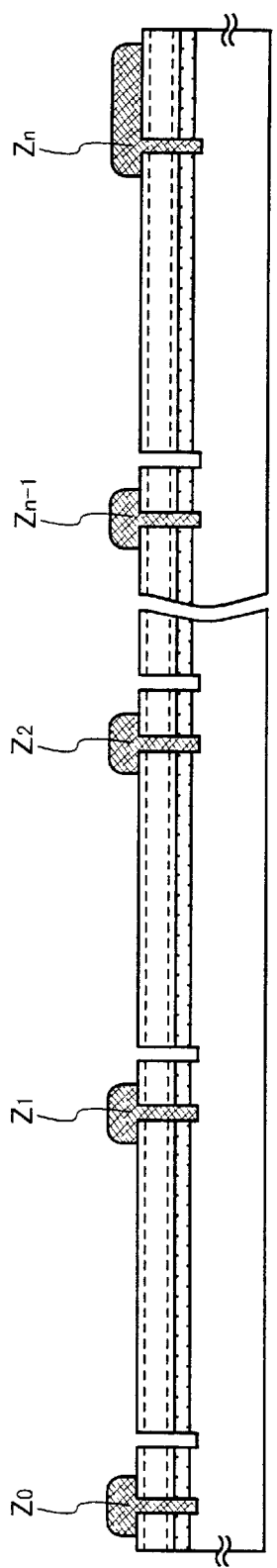

In this way, the transparent electrode layer 102 is divided into $T_1$ to $T_n$, and the photoelectric conversion layer 103 is divided into $K_1$ to $K_n$. Then, as shown in FIG. 1C, insulating resin layers $Z_0$ to $Z_n$ filling the openings $M_0$ to $M_n$ and further covering the upper end portions are formed.

For the purpose of forming the insulating resin layers $Z_0$ to $Z_n$ by a screen printing method, the following insulating resin material was prepared.

phenoxy resin (manufactured by UCC Inc.: PKHH Mn = 15,400), 20 pts.

cyclohexane, 40 pts.

isophorone, 30 pts.

high resistance carbon black (manufactured by Degussa Inc.: average particle diameter of 25 nm), 4 pts.

aerosil (manufactured by Degussa Inc.: average particle diameter of 15 nm), 10 pts.

dispersing agent (oleic acid), 3 pts.

antifoaming agent (manufactured by Toshiba Silicone Co., Ltd.: TSA-720), 1 part by weight leveling agent (manufactured by Sin-etsu Silicone Co., Ltd.: KS-66), 1 pts.

First, among the above raw materials, phenoxy resin was completely dissolved in a mixture solvent of cyclohexane/isophorone, and was dispersed for 48 hours by a ball mill made of zirconia, together with carbon black, aerosil and dispersing agent. Next, the antifoaming agent and leveling agent were added and were further mixed for two hours. Next, thermal crosslinking reactive component resins described below were added thereto.

n-butylated melamine resin (manufactured by Mitsui Toatsu Chemical Co., Ltd.: U-VAN 21R: weight average molecular weight of about 7000), 5 pts. hardening accelerator (manufactured by Mitsui Toatsu Chemical Co., Ltd.: Catalyst 6000), 0.03 pts.

These were further mixed and dispersed for 20 minutes to obtain an insulating resin composite for a passivation film.

The obtained insulating resin composite ink was used, and the insulating film was formed by using the screen printing method. After application, thermal hardening was conducted in an oven for 20 minutes at 160° C. to obtain the insulating resin layers $Z_0$ to $Z_n$.

Figure 2:
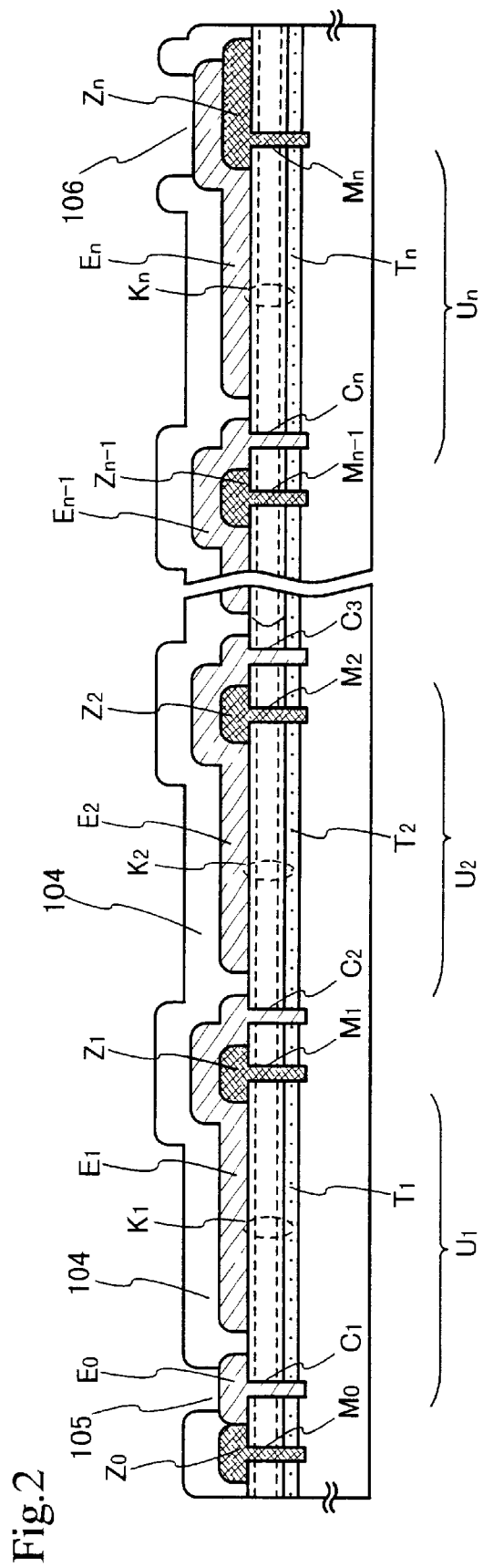
FIG. 2 is a sectional view showing a state where the solar cell is completed.

Next, for the purpose of forming rear electrode layers $E_0$ to $E_n$ as shown in FIG. 2 by the screen printing method, the following were prepared for ink to be used. In addition to the following, conductive fine particles such as ITO, $SnO_2$, ZnO, Ag, Cu, Ni, or Mo may be added to increase the conductivity.

graphitized carbon black, e.g., graphite powder CPB-5000 manufactured by Chuetsu Graphite Industry Co., Ltd.), 9 pts.

high conductive black #3950 (16 nm) manufactured by Mitsubishi Chemical Corp., 6 pts.

oleic acid (dispersing agent) of 0.5 pts.

isophorone (solvent), 20 pts.

These were put into a ball mill to crush them for 24 hours, and obtain finer particles. Next, 75 pts. of 20 wt % γ-butyrolactone lacquer of saturated polyester resin having the following contents were put into them.

VYLON 220 (OH value of about 55 KOHmg/g) manufactured by Toyobo Co., Ltd., 7 pts.

VYLON 200 (OH value of about 5 KOHmg/g) manufactured by Toyobo Co., Ltd., 5 pts.

VYLON 630 (OH value of about 42 KOHmg/g) manufactured by Toyobo Co., Ltd., 3 pts.

γ-butyrolactone (solvent), 60 pts.

Then, an antifoaming agent and a leveling agent having the following contents were added thereto.

antifoaming agent (manufactured by Toshiba Silicone Co., Ltd.: TSA-720), 2 pts. leveling agent (manufactured by Sin-etsu Silicone Co., Ltd.: KS-66) of 0.5 pts.

Further, a paste obtained after dispersing and mixing by the ball mill for 24 hours was further dispersed by a three-roll mill to obtain a conductive carbon paste.

This paste was added with 5 pts. of ethyl acetoacetate block body (solid content 80 wt %, NCO content 10 wt %) Coronate 2513 (manufactured by Nippon Polyurethane Kogyo Co., Ltd.) which was obtained by blocking isocynate group of hexamethylenediisocynate-based polyisocynate of aliphatic polyfunctional isocynate by ethyl acetoacetate and by diluting it with a solvent of cellosolve acetate and xylene at one to one, mixing was sufficiently manufactured by disper, and defoaming was sufficiently made to obtain a conductive carbon paste.

Then, the obtained conductive carbon paste was printed into a predetermined pattern by the screen printing method, and after leveling and drying, it was firmly hardened at 150° C. for 30 minutes to form the rear electrode layers $E_0$ to $E_n$ as shown in FIG. 2.

If doing so, although the rear electrode layers come in contact with the n-type layer 103c of the photoelectric conversion layer, in order to make this contact ohmic contact and further to lower the contact resistance, it is necessary that the n-type layer 103c is formed of μc-Si:H, and its thickness is made 30 to 80 nm.

The respective rear electrodes $E_1$ to $E_n$ are formed so as to be connected with the transparent electrode layers $T_1$ to $T_n$ at the openings $C_1$ to $C_n$. The same material as the rear electrode is filled in the openings $C_1$ to $C_n$, and in this way, the rear electrode $E_{n-1}$ is electrically connected to the transparent electrode $T_n$.

Finally, in order to form a sealing resin layer 104 by the printing method, as a sealing resin raw material, the following was prepared.

epoxy resin (manufactured by Yuka-Shell Epoxy K.K.: Epikote 1009, molecular weight of about 3750), 20 pts.

γ-butyrolactone, 40 pts.

isophorone, 30 pts.

antifoaming agent (manufactured by Toshiba Silicone Co., Ltd.: TSA-720), 3 pts.

leveling agent (manufactured by Shin-etsu Silicone Co., Lt.: KS-66), 1 pts.

First, among the above raw materials, epoxy resin was completely dissolved in a mixture solvent of γ-butyrolactone/isophorone, and was dispersed for 48 hours by a ball mill made of zirconia. Next, the antifoaming agent and the leveling agent were added and further mixed for 2 hours, and a thermal crosslinking reactive component described below was added.

butylated melamine resin (manufactured by Mitsui Chemical Corp.: U-VAN 20SE-60: molecular weight of about 3500 to 4000), 5 pts.

These were further mixed and dispersed for 20 minutes to obtain a transparent composite for an insulating surface protecting sealing film.

The ink of the obtained composite for the insulating surface protecting sealing film was used, and the sealing resin layer 104 was formed by using the screen printing method, and was thermally hardened at 150° C. for 30 minutes. In the sealing resin layer 104, opening portions 105 and 106 were respectively formed on the rear electrodes $E_0$ and $E_n$, with the result that they were connected to an external circuit substrate at these portions.

In the manner as described above, a unit cell made of the transparent electrode $T_n$, the photoelectric conversion layer $K_n$ and the rear electrode layer $E_n$ is formed on the substrate 101, and the adjacent rear electrode $E_{n-1}$ is connected to the transparent electrode $T_1$ through the opening $C_n$, with the result that a solar cell of the n series-connected unit cells can be fabricated. The rear electrode $E_0$ becomes a lead-out electrode of the transparent electrode $T_1$ in the unit cell $U_1$.

In the solar cell fabricated in this embodiment, the sheet resistance of the transparent electrode layer is 120 to 150 Ω/□, and that of the rear electrode layer is 30 to 80 Ω/□. These values are high as compared with an aluminum film suitably used for a rear electrode material of a solar cell having a sheet resistance of 1 Ω/□ or less. However, like this, when the resistance values of the transparent electrode layer and the rear electrode layer are made the same level and are balanced, the resistance against electrostatic damage can be remarkably improved.

Embodiment 2

Another embodiment of the present invention will be described with reference to FIGS. 3A to 3C and FIG. 4. In FIG. 3A, a substrate 301, a transparent electrode layer 302, and a photoelectric conversion layer 303 are formed in the same manner as the embodiment 1. Then, rear electrodes (XE) are formed on the photoelectric conversion layer 303 by the screen printing method like Embodiment 1.

Then, as shown in FIG. 3B, openings $XM_0$ to $XM_n$ and $XC_1$ to $XC_n$ reaching the transparent electrode layer 302 from the photoelectric conversion layer 303 are formed by a laser working method. The openings $XM_o$ to $XM_n$ are openings for insulation and separation and for forming unit cells, and the openings $XC_1$ to $XC_n$ are for forming connection between the transparent electrode and the rear electrode.

At the laser working, there is a case where a residue remains at the periphery of the opening. This residue is a spray of a material to be worked, and since the spray heated up to a high temperature by laser light is attached to the surface of the photoelectric conversion layer 303 to damage the film, it is originally undesirable. In order to prevent this, the rear electrode is formed in accordance with the pattern of the openings, and then, the laser working is carried out, with the result that damage to at least the photoelectric conversion layer 303 can be prevented.

After the transparent electrode layer 302 is divided into $XT_1$ to $XT_n$, and the photoelectric conversion layer 303 is divided into $XK_1$ to $XK_n$, insulating resin layers $XZ_0$ to $XZ_n$ filling the openings $XM_0$ to $XM_n$ and covering the upper end portions are formed by the screen printing method as shown in FIG. 3C.

Figure 4:
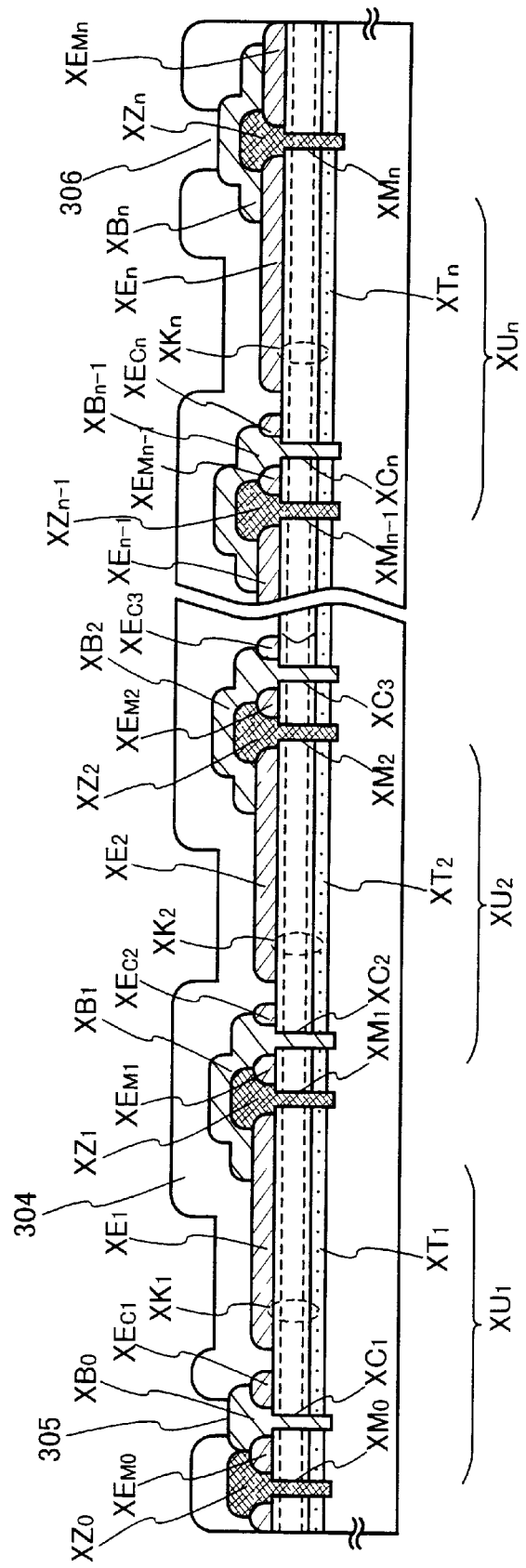
FIG. 4 is a sectional view showing a state where the solar cell is completed.

Next, as shown in FIG. 4, wiring lines $XB_0$ to $XB_{n-1}$ filling the openings $XC_1$ to $XC_n$ and connecting with the transparent electrodes $XT_1$ to $XT_n$ are formed by the screen printing method. The wiring lines $XB_0$ to $XB_{n-1}$ are formed of the same material as the rear electrode, and a thermosetting carbon paste is used. In this way, the rear electrode $XE_{n-1}$ is electrically connected to the transparent electrode $XT_n$.

Finally, a sealing resin layer 304 is formed by a printing method. Opening portions 305 and 306 are respectively formed in the sealing resin layer 304 on the wiring lines $XB_0$ and $XB_n$, and connected to an external circuit. In this way, a unit cell made of the transparent electrode $XT_n$, the photoelectric conversion layer $XK_n$, and the rear electrode layer $XE_n$ is formed on the substrate 301, and the adjacent rear electrode $XE_{n-1}$ is connected to the transparent electrode $XT_n$ through the opening $XC_n$, with the result that a solar cell of the n series-connected unit cells can be fabricated. The rear electrode $XB_0$ is a lead-out electrode of the transparent electrode $XT_1$ of the unit cell $XU_1$.

Embodiment 3

Figure 5:
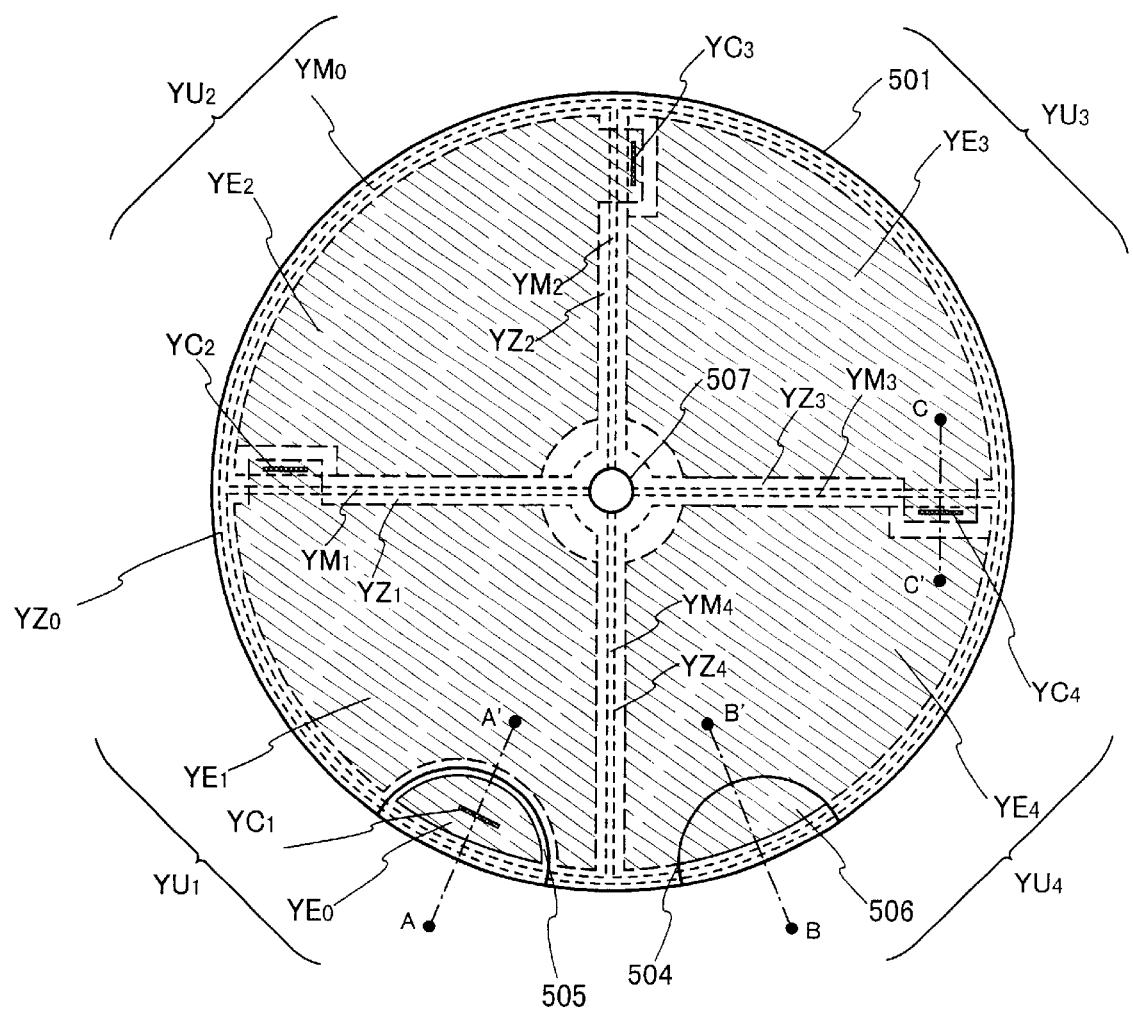
FIG. 5 is a plan view of a solar cell for a watch.

FIG. 5 is a top view of a case where a solar cell of this embodiment is seen from a rear electrode side. FIG. 5 shows an example of a solar cell arranged at the lower side (portion in which a movement of a wrist watch is installed) of a semitranslucent dial plate in the wrist watch. A substrate 501 is an organic resin film having a thickness of 70 μm, and although any of the organic resin materials set forth in Embodiment 1 can be applied, a PEN substrate is typically used. Although the shape of the substrate 501 is not limited to a circle, an insertion port 507 of a pointer shaft is provided at the center.

In the solar cell, a transparent electrode layer, a photoelectric conversion layer, a rear electrode layer, and a sealing resin layer are laminated from the side of the substrate 501. These are formed in the same manner as Embodiment 1 or Embodiment 2. Although four unit cells are concentrically arranged on the substrate 501, the structure of series connection of the solar cell is basically the same as the embodiment 1, or the structure like the embodiment 2 may be adopted.

In FIG. 5, unit cells $YU_1$ to $YU_4$ are formed by an opening $YM_0$ formed in the transparent electrode layer and the photoelectric conversion layer, and by openings $YM_1$ to $YM_4$ in the inside of the opening $YM_0$. The openings $YM_0$ to $YM_4$ are filled with insulating resin layers $YZ_0$ to $YZ_4$, and the insulating resin layers are formed so that the upper end portions of the openings $YM_0$ to $YM_4$ are covered.

Rear electrodes $YE_1$ to $YE_4$ are formed on the photoelectric conversion layer by the screen printing method using a thermosetting conductive carbon paste, and are respectively connected to transparent electrodes of the adjacent unit cell through openings $YC_2$ to $YC_4$. A sealing resin layer 504 is formed on the entire surface of the rear electrodes except for connection portions 505 and 506 to the circuit substrate of the wrist watch. An output electrode $YE_0$ at the side of the transparent electrode is formed at the connection portion 505 to the circuit substrate and is connected to the transparent electrode through an opening $YC_1$. Besides, as shown in the drawing, it is formed to be separate from the rear electrode $YE_1$. The one connection portion 506 is formed to serve also as the rear electrode $YE_4$.

Figure 6A:
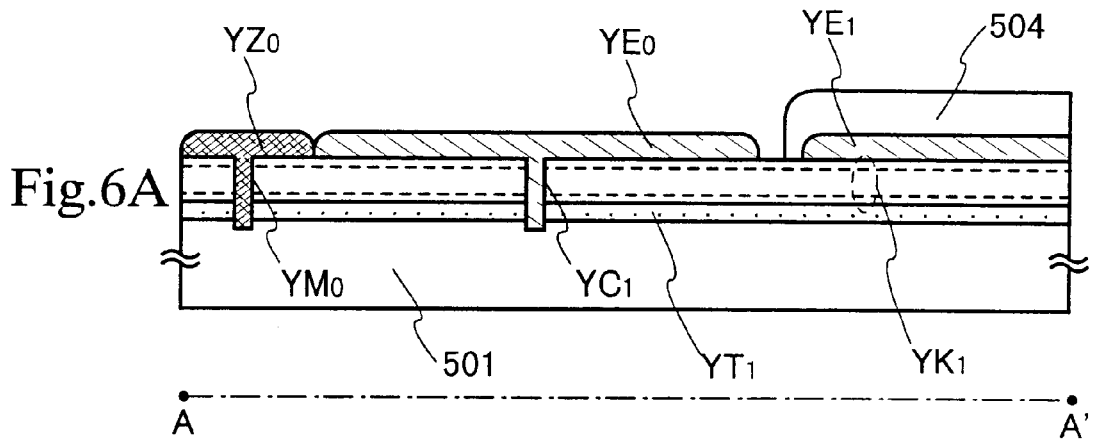
FIGS. 6A to 6C are partial sectional views of the solar cell for the watch.

FIG. 6A shows a section taken along A–A' of the periphery of the connection portion 505 to the circuit substrate in FIG. 5. The transparent electrode layer, the photoelectric conversion layer, and the rear electrode layer are formed on the substrate 501. The openings $YM_0$ and $YC_1$ are formed in the transparent electrode layer and the photoelectric conversion layer by the laser working method, and the insulating layer $YZ_0$ is formed on the opening $YM_0$ to fill the opening and further to cover its upper end portion. The output electrode $YE_0$ at the side of the transparent electrode is connected to the transparent electrode $YT_1$ of the unit cell $YU_1$ through the opening $YC_1$. The sealing resin layer 504 is formed on the rear electrode $YE_1$ of the unit cell $YU_1$.

Figure 6B:
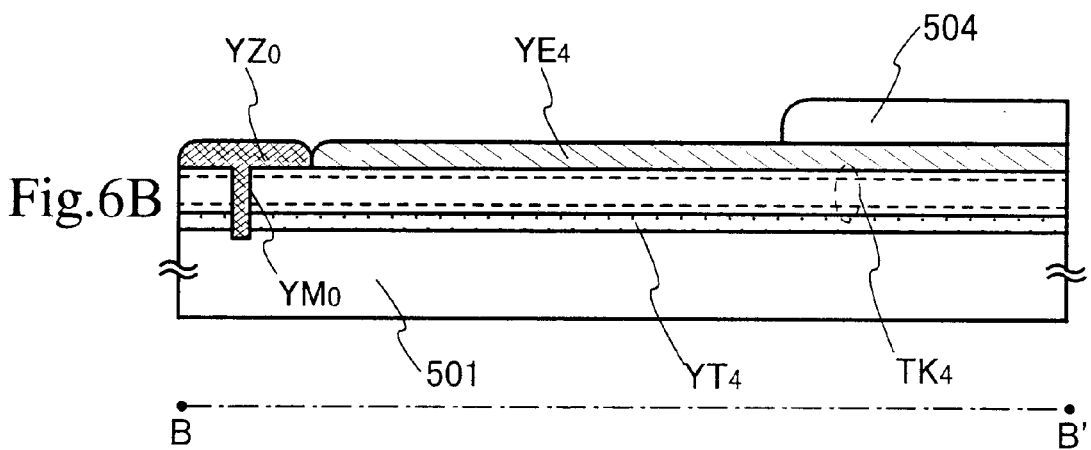

Similarly, FIG. 6B shows a section taken along B–B' of the periphery of the connection portion 506 to the external circuit, and the transparent electrode $YT_4$, the photoelectric conversion layer $YK_4$, and the rear electrode layer $YE_4$ are formed on the substrate 501. The transparent electrode $YT_4$ is formed at the inside of the end portion by the opening $YM_0$, and the insulating layer $YZ_0$ fills the opening and further covers its upper end portion. Although the sealing resin layer is formed on the rear electrode layer $YE_4$, it is not formed on the connection portion 506.

Figure 6C:
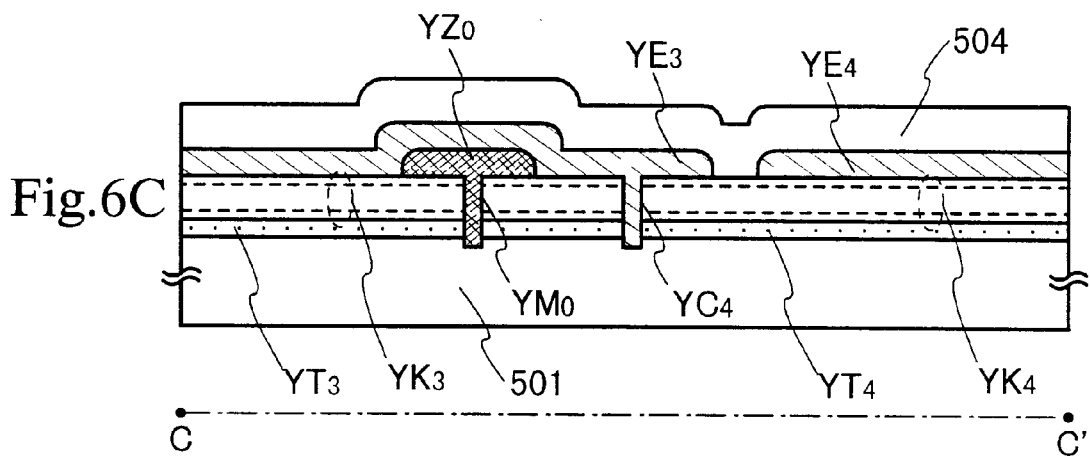

FIG. 6C shows a section taken along C–C' of the connection portion of the adjacent unit cells in FIG. 5. The transparent electrodes $YT_3$ and $YT_4$ are formed on the substrate 501, and are insulated and separated from each other by the opening $YM_0$ and the insulating layer $YZ_0$ formed to cover the opening and its upper end portion. Similarly, the photoelectric conversion layers $YK_3$ and $YK_4$ are also separated. With respect to the connection between the unit cells $YU_3$ and $YU_4$, a conductive material is filled in the opening $YC_4$, and the rear electrode $YE_3$ is connected to the transparent electrode $YT_4$.

Figure 7:
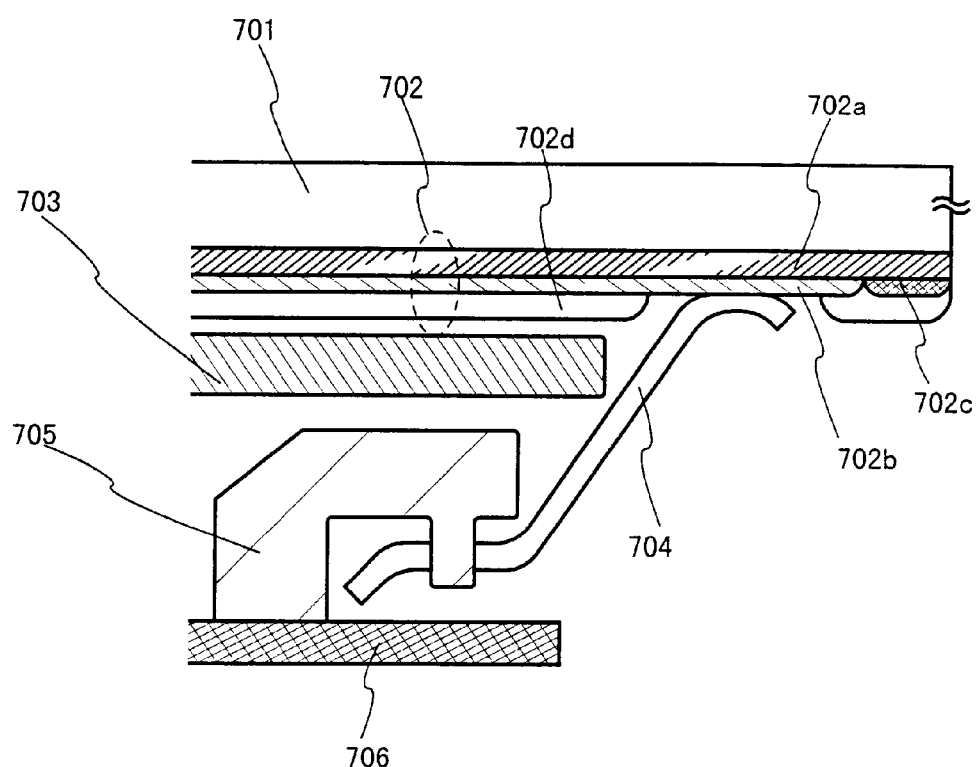
FIG. 7 is a view for explaining connection between an output terminal of a solar cell and a circuit substrate of an electric instrument.

In the manner as described above, it is possible to form the solar cell in which the four unit cells $YU_1$ to $YU_4$ are connected in series. In solar cells installed in various electric instruments such as a calculator or a watch, with respect to connection to a circuit of the electric instrument, there is an adopted method of direct connection using a coil spring or a plate spring, in addition to a connecting method using soldering or a thermosetting adhesive. FIG. 7 is a view for explaining an example of such a direct connection, and shows a state where connection between a photoelectric conversion device 702 and a circuit substrate is made through a connection spring. The structure of the photoelectric conversion device 702 is simply shown, and the drawing shows the state where a rear electrode 702b, an insulating resin 702c, and a sealing resin 702d are formed on a substrate 702a. In addition, a stainless structural body 703, a support body 701 and the like are included. A connection spring 704 is in contact with the rear electrode at an opening portion of the sealing resin 702d, and electrical connection is formed to a circuit substrate 706 through a terminal portion 705. The connection structure of a contact by applying pressure using mechanical force like this does not give severe damage to the solar cell as compared with a connection method such as soldering or heat sealing, and does not cause yield to be lowered in a manufacturing process. When the rear electrode is formed of metal material, the surface is oxidized by aging, with the result that contact resistance is increased. However, in the case where the carbon paste is used, such a problem does not occur.

According to the present invention, reliability at a connecting portion between a solar cell installed in an electric instrument, such as a watch, and a circuit substrate of the electric instrument can be improved. Besides, electrostatic withstand voltage can be improved, and the yield of a manufacturing process can be improved.

What is claimed is:

1. A solar cell comprising a transparent electrode layer, a photoelectric conversion layer, and a rear electrode layer, which are provided over a translucent substrate, wherein the rear electrode layer is a carbon electrode comprising a conductive film obtained by drying and hardening a paste which comprises as main ingredients fine particle carbon black and graphitized carbon black comprising conductive fine particles of at least one of ITO, $SnO_2$, ZnO, Ag, Cu, Ni, and Mo, and further comprises a binder resin, a solvent, and an additive.

2. A solar cell according to claim 1, wherein the transparent electrode layer has a sheet resistance of 120 to 150 $\Omega/\square$ and the rear electrode layer has a sheet resistance of 30 to 80 $\Omega/\square$.

3. A solar cell according to claim 1, wherein the rear electrode layer is in contact with an n-type microcrystalline semiconductor layer of the photoelectric conversion layer, and the n-type microcrystalline semiconductor layer has a thickness of 30 to 80 nm.

4. A solar cell comprising a transparent electrode layer, a photoelectric conversion layer, a rear electrode layer, and an output terminal, which are provided over a translucent substrate, wherein the rear electrode layer is a carbon electrode comprising a conductive film obtained by drying and hardening a paste which comprises as main ingredients fine particle carbon black and graphitized carbon black comprising conductive fine particles of at least one of ITO, $SnO_2$, $ZnO_2$, Ag, Cu, Ni, and Mo, and further comprises a binder resin, a solvent, and an additive, and wherein the output terminal is formed of the same material as the rear electrode layer.

5. A solar cell according to claim 4, wherein the transparent electrode layer has a sheet resistance of 120 to 150 $\Omega/\square$ and the rear electrode layer has a sheet resistance of 30 to 80 $\Omega/\square$.

6. A solar cell according to claim 4, wherein the rear electrode layer is in contact with an n-type microcrystalline semiconductor layer of the photoelectric conversion layer, and the n-type microcrystalline semiconductor layer has a thickness of 30 to 80 nm.

7. A solar cell comprising a transparent electrode layer, a photoelectric conversion layer, and a rear electrode layer, which are provided over a translucent substrate, wherein the rear electrode layer is a carbon electrode comprising a conductive film obtained by drying and hardening a paste which comprises as main ingredients fine particle carbon black and graphitized carbon black, and further comprises a binder resin comprising saturated polyester resin and block isocyanate.

8. A solar cell according to claim 7, wherein the transparent electrode layer has a sheet resistance of 120 to 150 $\Omega/\square$ and the rear electrode layer has a sheet resistance of 30 to 80 $\Omega/\square$.

9. A solar cell according to claim 7, wherein the rear electrode layer is in contact with an n-type microcrystalline semiconductor layer of the photoelectric conversion layer, and the n-type microcrystalline semiconductor layer has a thickness of 30 to 80 nm.

10. A solar cell comprising a transparent electrode layer, a photoelectric conversion layer, and a rear electrode layer, which are provided over a translucent substrate, wherein the rear electrode layer is a carbon electrode comprising a conductive film obtained by drying and hardening a paste which comprises as main ingredients fine particle carbon black and graphitized carbon black, and further comprises a binder resin comprising saturated polyester resin and block isocyanate, wherein an output terminal is formed of the same material as the rear electrode layer.

11. A solar cell according to claim 10, wherein the transparent electrode layer has a sheet resistance of 120 to 150 $\Omega/\square$ and the rear electrode layer has a sheet resistance of 30 to 80 $\Omega/\square$.

12. A solar cell according to claim 10, wherein the rear electrode layer is in contact with an n-type microcrystalline semiconductor layer of the photoelectric conversion layer, and the n-type microcrystalline semiconductor layer has a thickness of 30 to 80 nm.

13. A method of fabricating a solar cell, comprising:

a first step of forming a transparent electrode layer on a translucent substrate;

a second step of forming a photoelectric conversion layer on the transparent electrode layer;

a third step of forming a first opening and a second opening reaching the substrate in the transparent electrode layer and the photoelectric conversion layer;

a fourth step of forming an insulating layer covering the first opening and an upper end portion of the first opening;

a fifth step of forming a conductive layer covering the photoelectric conversion layer, the insulating layer, the second opening and an upper end portion of the second opening; and a sixth step of forming an insulating sealing resin layer on the photoelectric conversion layer and the conductive layer, wherein the conductive layer is a carbon electrode containing a conductive coating film obtained by drying and hardening a paste which contains as main ingredients fine particle carbon black and graphitized carbon black containing conductive fine particles of ITO, SnO$_2$, ZnO, Ag, Cu, Ni, or Mo, and further contains a binder resin, a solvent, and an additive.

14. A method of fabricating a solar cell, comprising:

a first step of forming a transparent electrode layer on a translucent substrate;

a second step of forming a photoelectric conversion layer on the transparent electrode layer;

a third step of forming a first conductive layer using a pattern on the photoelectric conversion layer;

a fourth step of forming a first opening and a second opening reaching the substrate in the transparent electrode layer and the photoelectric conversion layer;

a fifth step of forming an insulating layer covering the first opening and an upper end portion of the first opening;

a sixth step of forming a second conductive layer covering the photoelectric conversion layer, the insulating layer, the second opening and an upper end portion of the second opening; and a seventh step of forming a sealing resin layer on the photoelectric conversion layer and the conductive layer, wherein the conductive layer is a carbon electrode containing a conductive coating film obtained by drying and hardening a paste which contains as main ingredients fine particle carbon black and graphitized carbon black containing conductive fine particles of ITO, SnO$_2$, ZnO, Ag, Cu, Ni, or Mo, and further contains a binder resin, a solvent, and an additive.

15. A method of fabricating a solar cell, comprising:

a first step of forming a transparent electrode layer on a translucent substrate;

a second step of forming a photoelectric conversion layer on the transparent electrode layer;

a third step of forming a first opening and a second opening reaching the substrate in the transparent electrode layer and the photoelectric conversion layer;

a fourth step of forming an insulating layer covering the first opening and an upper end portion of the first opening;

a fifth step of forming a conductive layer, covering the photoelectric conversion layer, the insulating layer, the second opening and an upper end portion of the second opening; and a sixth step of forming an insulating sealing resin layer on the photoelectric conversion layer and the conductive layer, wherein the conductive layer is a carbon electrode containing a conductive coating film obtained by drying and hardening a paste which contains as main ingredients fine particle carbon black and graphitized carbon black, and further contains a binder resin.

16. A method of fabricating a solar cell, comprising:

a first step of forming a transparent electrode layer on a translucent substrate;

a second step of forming a photoelectric conversion layer on the transparent electrode layer;

a third step of forming a first conductive layer using a pattern on the photoelectric conversion layer;

a fourth step of forming a first opening and a second opening reaching the substrate in the transparent electrode layer and the photoelectric conversion layer;

a fifth step of forming an insulating layer covering the first opening and an upper end portion of the opening;

a sixth step of forming a second conductive layer covering the photoelectric conversion layer, the insulating layer, the second opening and an upper end portion of the second opening; and a seventh step of forming a sealing resin layer on the photoelectric conversion layer and the conductive layer, wherein the conductive layer is a carbon electrode containing a conductive coating film obtained by drying and hardening a paste which contains as main ingredients fine particle carbon black and graphitized carbon black, and further contains a binder resin.

* * * * *